United States Patent
Jang

(10) Patent No.: US 8,003,505 B2
(45) Date of Patent: Aug. 23, 2011

(54) IMAGE SENSOR AND METHOD OF FABRICATING THE SAME

(75) Inventor: Hoon Jang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 121 days.

(21) Appl. No.: 12/579,490

(22) Filed: Oct. 15, 2009

(65) Prior Publication Data

US 2010/0102367 A1    Apr. 29, 2010

(30) Foreign Application Priority Data

Oct. 23, 2008   (KR) .................. 10-2008-0104139

(51) Int. Cl.
*H01L 21/3205* (2006.01)
*H01L 21/44* (2006.01)

(52) U.S. Cl. ........ 438/586; 438/599; 438/652; 438/666; 438/687; 438/688

(58) Field of Classification Search .................. 438/586, 438/599, 652, 666, 687, 688; 257/E21.023, 257/E21.615

See application file for complete search history.

(56) References Cited

U.S. PATENT DOCUMENTS

| | | | |
|---|---|---|---|
| 7,436,012 B2 * | 10/2008 | Mori et al. | 257/292 |
| 7,723,721 B2 * | 5/2010 | Udagawa et al. | 257/40 |
| 2006/0027804 A1 * | 2/2006 | Yamazaki et al. | 257/59 |
| 2010/0230728 A1 * | 9/2010 | Okagawa et al. | 257/222 |
| 2011/0027934 A1 * | 2/2011 | Naruse et al. | 438/59 |

FOREIGN PATENT DOCUMENTS

| KR | 10-2004-0017040 | 2/2004 |
|---|---|---|
| KR | 10-2005-0042698 | 5/2005 |

* cited by examiner

*Primary Examiner* — Ngan Ngo

(74) *Attorney, Agent, or Firm* — Sherr & Vaughn, PLLC

(57) ABSTRACT

A method of fabricating an image sensor. A method of fabricating an image sensor may include preparing a substrate including a pixel region and/or a logic region having transistors and/or gates. A method of fabricating an image sensor may include forming a first interlayer dielectric film on and/or over a substrate to cover gates. A method of fabricating an image sensor may include forming a first dielectric film to expose an upper surface of at least one gate over a pixel region. A method of fabricating an image sensor may include forming a second interlayer dielectric film over a first interlayer dielectric film and/or dielectric film. A method of fabricating an image sensor may include forming a plurality of contact holes, which may be simultaneously formed over a second interlayer dielectric film. An image sensor may include contacts formed over a second interlayer dielectric film. An image sensor is disclosed.

13 Claims, 8 Drawing Sheets

IMAGE SENSOR AND METHOD OF FABRICATING THE SAME

The present application claim priority under 35 U.S.C. 119 to Korean Patent Application No. 10-2008-0104139 (filed on Oct. 23, 2008) which is hereby incorporated by reference in its entirety.

BACKGROUND

Embodiments relate to a semiconductor device. Some embodiments relate to a method of fabricating a CMOS image sensor.

Image sensors may refer to semiconductor devices which may change an optical image into an electric signal. Image sensors may be categorized as a Charge Coupled Device (CCD) image sensor and/or a Complementary Metal-Oxide-Silicon (CMOS) image sensor. An image sensor may include a pixel region having photodiodes to sense light, and/or a logic region to process sensed light into an electric signal to obtain optical data. An image sensor may refer to a device which receives light incident on and/or over a pixel region which may capture an image using photodiodes of respective pixels and/or at least one transistor.

Figure 1:
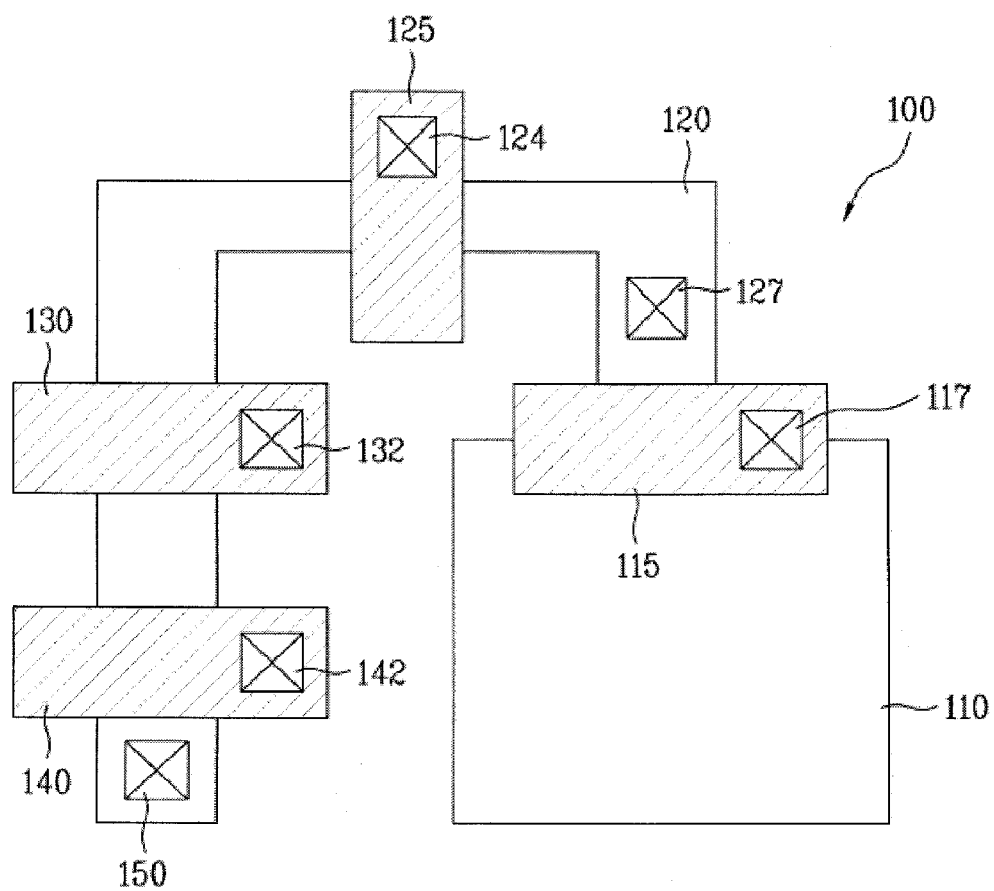

Referring to FIG. 1, a layout 100 of a unit pixel of an image sensor may have a 4-TR structure. A unit pixel of an image sensor may include a photodiode region 110, a transfer transistor (Tx) 115, a floating diffusion region 120, a reset transistor 125, a drive transistor 130, a select transistor 140, and/or a plurality of metal contacts 117, 124, 127, 132, 142, and/or 150. A plurality of metal contacts 117, 124, 127, 132, 142, and/or 150 may be connected to an active region and/or gate electrodes of transistors.

A metal contact etching process, which may be one processes used to fabricate an image sensor, may be performed simultaneously on and/or over a pixel region and a logic region that may be in common. It is important to form a contact while reducing damage to photodiodes due to etching in a metal contact etching process. Damage to a silicon surface on and/or over a pixel region of an image sensor, which may be sensitive to a dark current property, may result from a metal contact etching process and may need to be minimized.

An etching depth may be relatively increased to assure an etching margin to form contact holes on and/or over a logic region. However, an etching depth to contact holes on and/or over a pixel region may be relatively increased. Therefore, photodiodes including a floating diffusion region may be damaged, and/or leakage current may be maximized. A dark current property may be minimized. On the other hand, when an etching margin to the contact holes on and/or over a logic region may be relatively reduced to prevent damage to a pixel region due to etching, contacts on and/or over a logic region having many circuits may not be properly formed.

Accordingly, there is an need for an image sensor and a method of manufacturing an image sensor which may substantially prevents a pixel region from being damaged by an etching process to form contact holes. There is a need for an image sensor and a method of manufacturing an image sensor which may maximize a dark current property and/or secures a yield.

SUMMARY

Embodiments relate to a method of fabricating a CMOS image sensor. According to embodiments, a method of fabricating an image sensor may substantially prevents a pixel region from being damaged by an etching process to form contact holes. In embodiments, a dark current property may be maximized. In embodiments, a yield may be secured.

Embodiments relate to a method of fabricating an image sensor. According to embodiments, a method of fabricating an image sensor may include preparing a substrate, on and/or over which a pixel region and/or a logic region may be defined. In embodiments, an image sensor may be provided with transistors including gates formed on and/or over a pixel region and/or a logic region. In embodiments, a method of fabricating an image sensor may include forming a first interlayer dielectric film, which may cover gates, on and/or over a surface of a substrate, which may be the entire surface of the substrate. In embodiments, a method of fabricating an image sensor may include forming first contact holes exposing a region of a substrate and a part of a gate on and/or over a pixel region by selectively etching a first interlayer dielectric film formed on and/or over a pixel region.

According to embodiments, a method of fabricating an image sensor may include forming first contacts, for example by filling first contact holes with a metal material. In embodiments, a method of fabricating an image sensor may include forming a second interlayer dielectric film on and/or over a surface, which may be an entire surface, of a first interlayer dielectric film. In embodiments, a method of fabricating an image sensor may include simultaneously forming second contact holes, which may penetrate a second interlayer dielectric film on and/or over a pixel region to expose first contacts, and/or forming third contact holes. In embodiments, third contact holes may penetrate a second interlayer dielectric film and/or a first interlayer dielectric film on and/or over a logic region to expose a part of a gate and a region of a substrate on and/or over a logic region. In embodiments, a method of fabricating an image sensor may include forming second contacts, for example by filling second contact holes and/or third contact holes with a metal material.

Embodiments relate to a method of fabricating an image sensor. According to embodiments, a method of fabricating an image sensor semiconductor device may include preparing a substrate, on and/or over which a pixel region and/or a logic region may be defined. In embodiments, an image sensor may be provided with transistors including gates formed on and/or over a pixel region and/or a logic region. In embodiments, a method of fabricating an image sensor may include forming a first dielectric film, which may expose an upper surface of a gate on and/or over a pixel region on and/or over a surface, which may be an entire surface, of a substrate. In embodiments, a method of fabricating an image sensor may include forming a first contact hole exposing one region of a substrate on and/or over a pixel region by selectively etching the first dielectric film on and/or over a pixel region.

According to embodiments, a method of fabricating an image sensor may include forming a first contact, for example by filling a first contact hole with a metal material. In embodiments, a method of fabricating an image sensor may include forming a second dielectric film on and/or over a surface, which may be an entire surface, of a first dielectric film. In embodiments, a method of fabricating an image sensor may include simultaneously forming second contact holes exposing a first contact and/or a part of a gate on and/or over a pixel region and/or a part of a gate and/or a part of a substrate on and/or over a logic region. In embodiments, a second dielectric film may be selectively etched. In embodiments, a method of fabricating an image sensor may include forming second contacts by filling second contact holes with a metal material.

DRAWINGS

Example FIG. 1 is a layout illustrating a unit pixel of an image sensor having a 4-TR structure.

Example FIG. 2A to FIG. 2F are longitudinal-sectional views illustrating a method of fabricating an image sensor in accordance with embodiments.

Example FIG. 3A to FIG. 3E are longitudinal-sectional views illustrating a method of fabricating an image sensor in accordance with embodiments.

Figure 4:
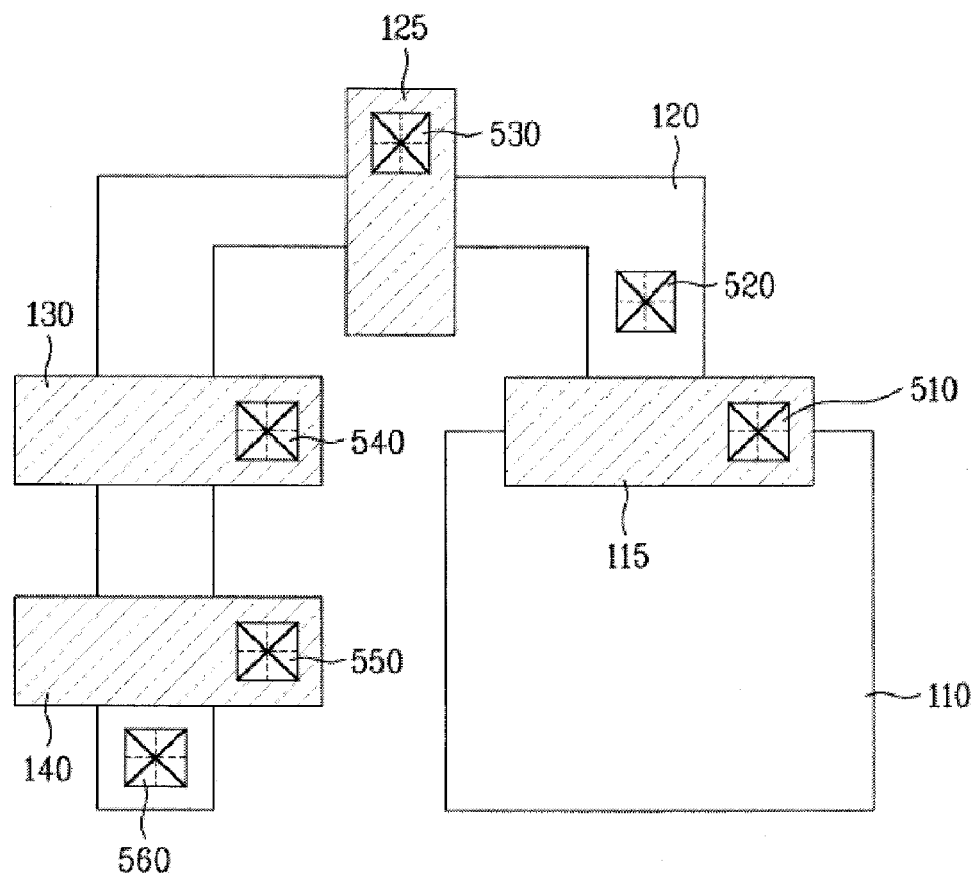

Example FIG. 4 is a layout illustrating contacts of a unit pixel formed by a method in accordance with embodiments.

DESCRIPTION

Figure 2A:
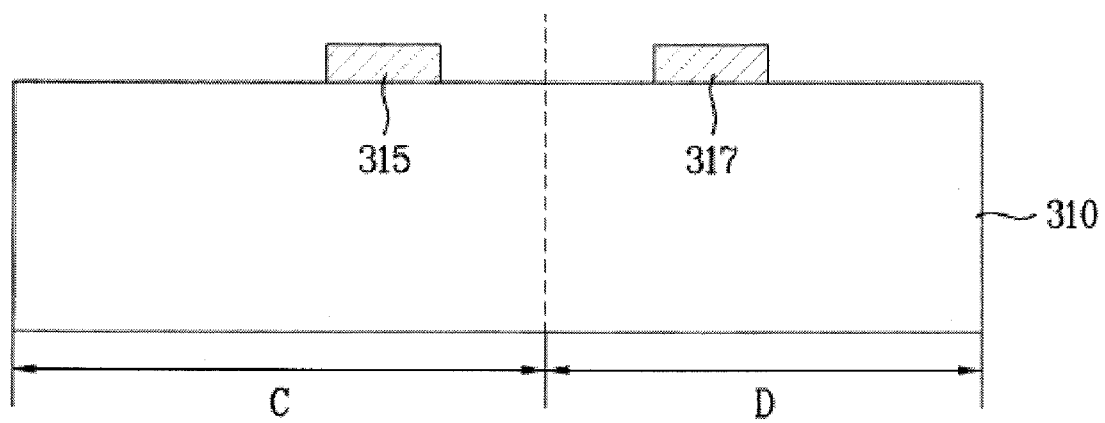

Embodiments relate to a method of fabricating an image sensor. Referring to example FIG. 2A to FIG. 2F, longitudinal-sectional views illustrate a method of fabricating an image sensor in accordance with embodiments. Referring to FIG. 2A, a substrate may be prepared such that pixel region C and/or logic region D may be defined. In embodiments, a substrate may include a silicon substrate. In embodiments, unit pixels which may sense light may be formed on and/or over a substrate, which may be on and/or over pixel region C. In embodiments, a logic circuit may include at least one transistor to process light sensed by pixel region C into an electric signal, to obtain optical data which may be formed on and/or over logic region D.

According to embodiments, at least one transistor may be formed on and/or over a substrate, for example on and/or over pixel region C and/or logic region D. In embodiments, for example as illustrated in FIG. 2A, gates 315 and/or 317 of the at least one transistor formed on and/or over pixel region C and/or the at least one transistor formed on and/or over logic region D, respectively, may be formed.

Figure 2B:
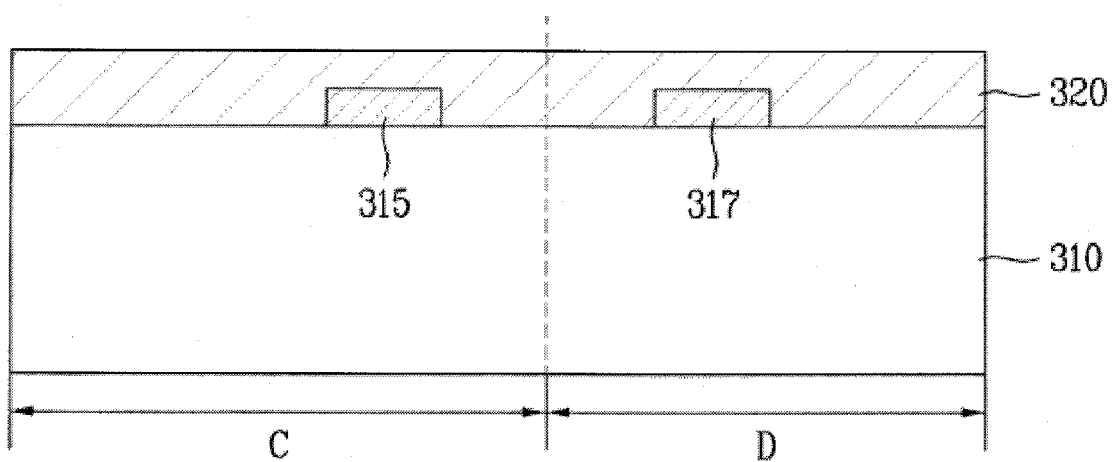

Referring to FIG. 2B, a first interlayer dielectric film 320 may be formed on and/or over a surface of substrate 310, which may be an entire surface of substrate 310. According to embodiments, first interlayer dielectric film 320 may be formed on and/or over pixel region C and/or logic region D including gates 315 and/or 317. In embodiments, first interlayer dielectric film 320 may include Boro-Phospho Silicate Glass (BPSG) and/or Tetra-Ethyl-Ortho-Silicate (TEOS). In embodiments, first interlayer dielectric film 320 may be formed by deposition, and may have at a thickness sufficient to cover gates 315 and/or 317.

Figure 2C:
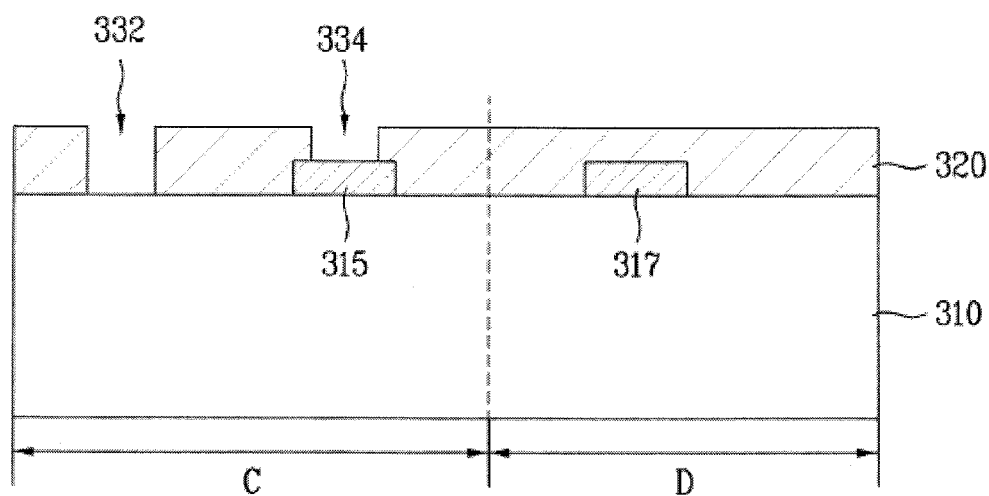

Referring to FIG. 2C, contact holes 332 and 334 may expose a region of substrate 310 and/or a part of gate 315. According to embodiments, contact holes may be formed by selectively etching first interlayer dielectric film 320 formed on and/or over pixel region C. In embodiments, a contact hole exposing a region of substrate 310 may be referred to as a first contact hole 332. In embodiments, a contact hole exposing part of gate 315 may be referred to as a second contact hole 334.

According to embodiments, a first photoresist pattern may be formed by carrying out a photolithography process on and/or over first interlayer dielectric film 320. A first photoresist pattern may cover first interlayer dielectric film 320 formed on and/or over logic region D, and may expose first interlayer dielectric film 320 corresponding to a region to be exposed of substrate 310 and/or a part of gate 315 to be exposed. In embodiments, contact holes 332 and/or 334 may be formed by etching first interlayer dielectric film 320 using a first photoresist pattern as an etching mask. In embodiments, a first photoresist pattern may be removed after contact holes 332 and/or 334 are formed.

Figure 2D:
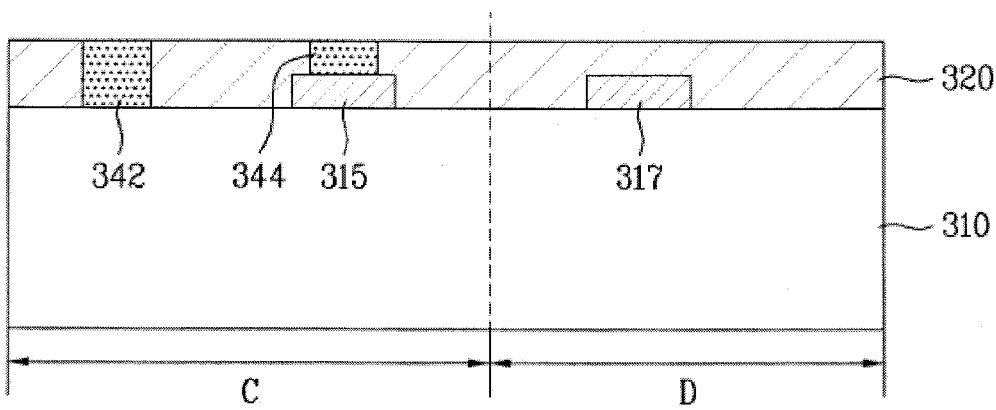

Referring to FIG. 2D, metal contacts 342 and/or 344 may be formed on and/or over pixel region C, for example by filling contact holes 332 and 334 with a metal material. According to embodiments, metal contacts 342 and/or 344 may be formed by depositing a metal material on and/or over a surface of first interlayer dielectric film 320, which may be the entire surface of the first interlayer dielectric film 320, provided with contact holes 332 and/or 334 to fill contact holes 332 and/or 334. In embodiments, a Chemical Mechanical Polishing (CMP) process may be carried out.

According to embodiments, a metal material may include tungsten, copper, or aluminum. In embodiments, a contact formed on and/or over first contact hole 332 may be referred to as first contact 342. In embodiments, a contact formed on and/or over second contact hole 334 may be referred to as second contact 344.

Figure 2E:
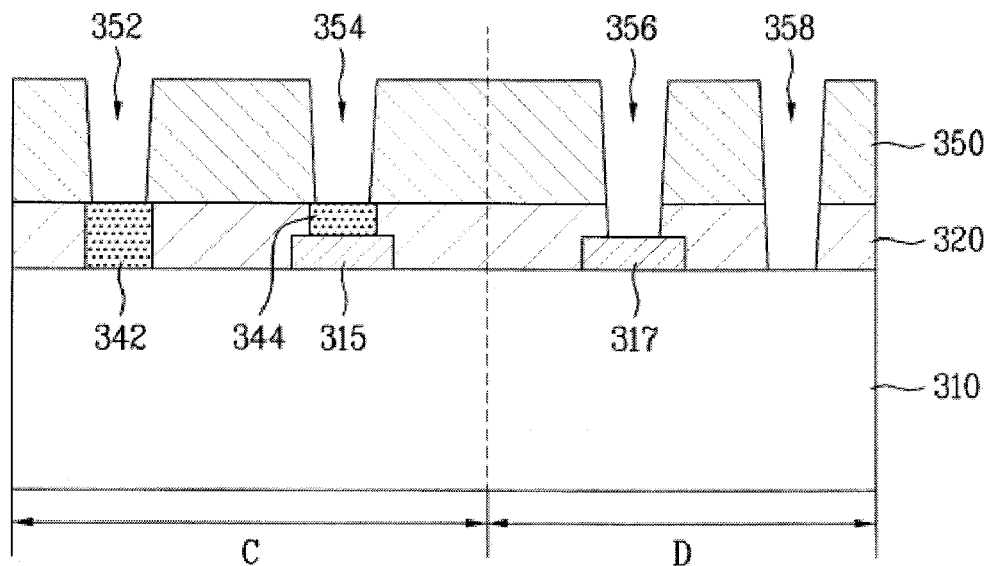

Referring to example FIG. 2E, second interlayer dielectric film 350 may be formed on and/or over a surface of first interlayer dielectric film 320, which may be an entire surface of first interlayer dielectric film 320, provided with metal contacts 342 and/or 344. In embodiments, second interlayer dielectric film 350 may be formed on and/or over first interlayer dielectric film 320 on and/or over pixel region C and/or logic region D. In embodiments, second interlayer dielectric film 350 may include BPSG and/or TEOS.

According to embodiments, contact holes 352 and/or 354 may be formed through second interlayer dielectric film 350 on and/or over pixel region C to expose respective contacts 342 and/or 344. In embodiments, contact holes 356 and/or 358 may be formed through second interlayer dielectric film 350 and/or over first interlayer dielectric film 320 on and/or over logic region D to expose a part of gate 317 and/or a region of substrate 310. In embodiments, contact holes may be simultaneously formed.

According to embodiments, a second photoresist pattern may be formed by carrying out a photolithography process on and/or over second interlayer dielectric film 350. A second photoresist pattern may expose regions of second interlayer dielectric film 350 corresponding to contacts 342 and/or 344 formed on and/or over pixel region C and other regions of second interlayer dielectric film 350 corresponding to a part of gate 317 and/or a region of substrate 310 on and/or over a logic region, such as logic region D. In embodiments, second interlayer dielectric film 350 and first interlayer dielectric film 320 on and/or over pixel region C and/or logic region D may be simultaneously etched, for example using second photoresist pattern as an etching mask.

According to embodiments, referring to pixel region C, contact holes may not be formed within a single thick interlayer dielectric film but instead contact holes may be formed within several relatively thin interlayer dielectric layers. In embodiments, an etching depth on and/or over pixel region C may be relatively small. In embodiments, damage to pixel region C due to etching may be minimized.

According to embodiments, contacts 342 and/or 344 formed on and/or over pixel region C may serve as a blocking barrier during an etching process to form contact holes on and/or over logic region D. In embodiments, damage to silicon, for example a photodiode region, of pixel region C may be minimized. In embodiments, first interlayer dielectric film 320 on and/or over logic region D may be continuously etched after an etching of second interlayer dielectric layer 350 has been completed, but first interlayer dielectric film 320 on and/or over pixel region C may be scarcely etched due to high etching selectivity. Therefore, although first interlayer dielectric layer 320 on and/or over logic region D may be sufficiently etched, damage to pixel region C due to etching may be substantially prevented by a blocking effect of contacts 342 and/or 344.

Figure 2F:
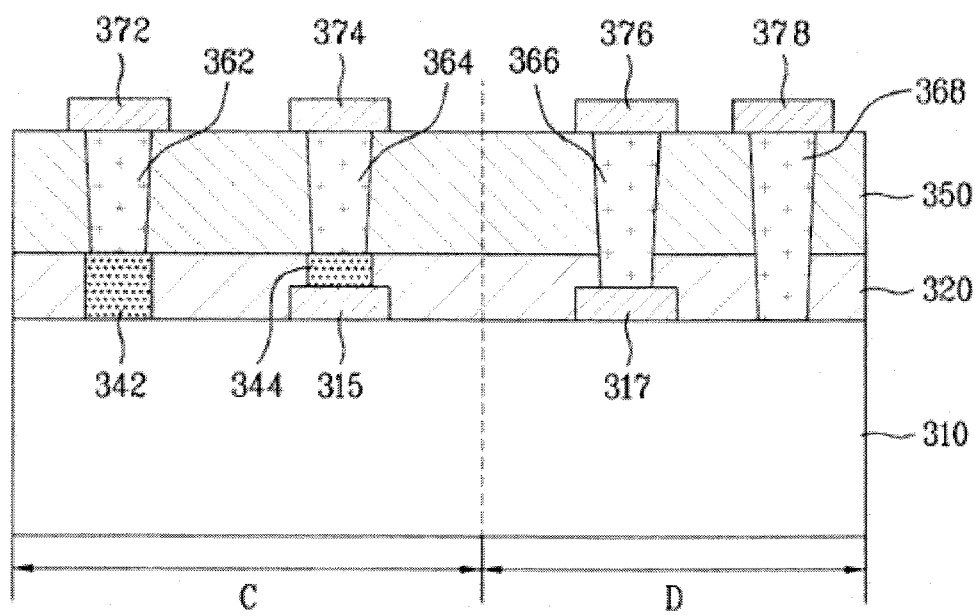

Referring to FIG. 2F, second contacts 362, 364, 366, and/or 368 may be formed by filling respective contact holes 352, 354, 356, and/or 358 formed on and/or over pixel region C and/or logic region D with a metal material. According to embodiments, a metal material may include tungsten, copper, and/or aluminum. In embodiments, second contacts 362, 364, 366, and/or 368 may be formed by depositing metal material on and/or over a surface, which may be an entire surface, of second interlayer dielectric film 350 on and/or over pixel region C and/or logic region D to fill contact holes 352, 354, 356, and/or 358. In embodiments, planarization through a CMP process may be carried out. In embodiments, metal lines 372, 374, 376, and/or 378 may be formed on and/or over an upper surfaces of respective second contacts 362, 364, 366, and/or 368.

Figure 3A:
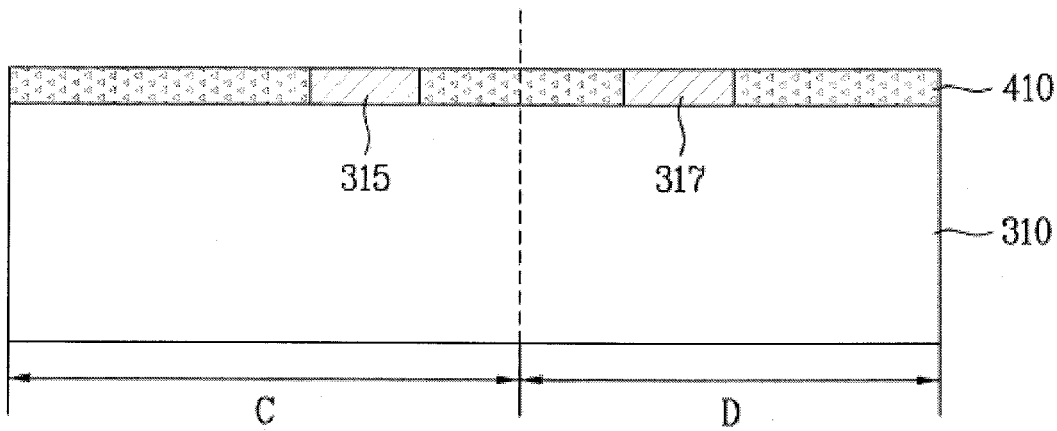

Embodiments relate to a method of manufacturing an image sensor. Referring to example FIG. 3A to FIG. 3E, longitudinal-sectional views illustrate a method of fabricating an image sensor in accordance with embodiments. Referring to FIG. 3A, at least one transistor may be formed on and/or over a substrate on and/or over pixel region C and/or logic region D. In embodiments, for example as illustrated in FIG. 3A, gates 315 and/or 317 of at least one transistor formed on and/or over pixel region C and/or at least one transistor formed on and/or over logic region D may be formed.

Figure 3B:
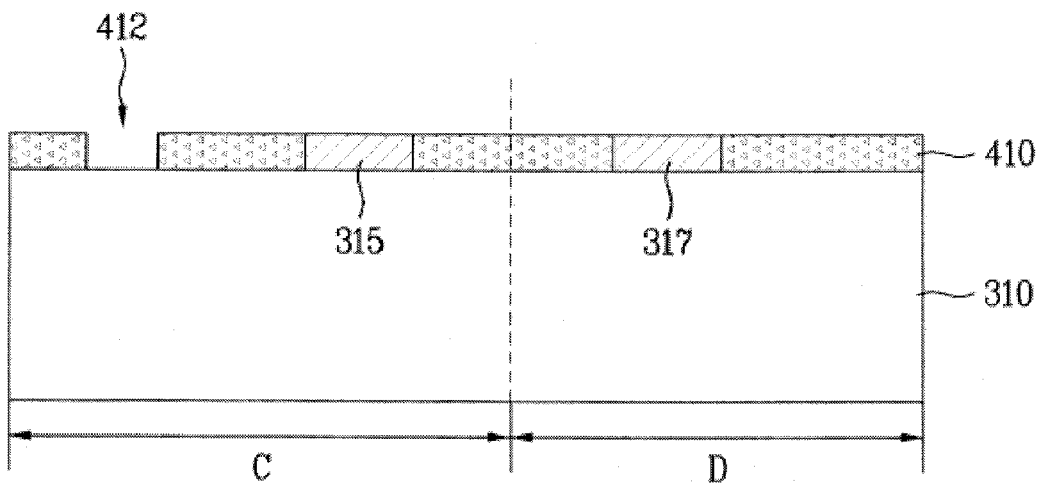

Referring to FIG. 3B, first dielectric film 410 may be formed which may expose an upper surface of gate 315 on and/or over a pixel region. In embodiments, first dielectric film 410 may be formed on and/or over a surface of a substrate, which may be an entire surface of substrate 310 on and/or over pixel region C. In embodiments, logic region D may be include gate 317.

According to embodiments, first dielectric film 410 may include Boro-Phospho Silicate Glass (BPSG) and/or Tetra-Ethyl-Ortho-Silicate (TEOS). In embodiments, BPSG and/or TEOS may be deposited on and/or over a surface, which may be an entire surface, of substrate 310 on and/or over pixel region C and/or logic region D provided including respective gates 315 and/or 317. In embodiments, a CMP process may be carried out until an upper surface of gate 315 on and/or over a pixel region is exposed.

Figure 3C:
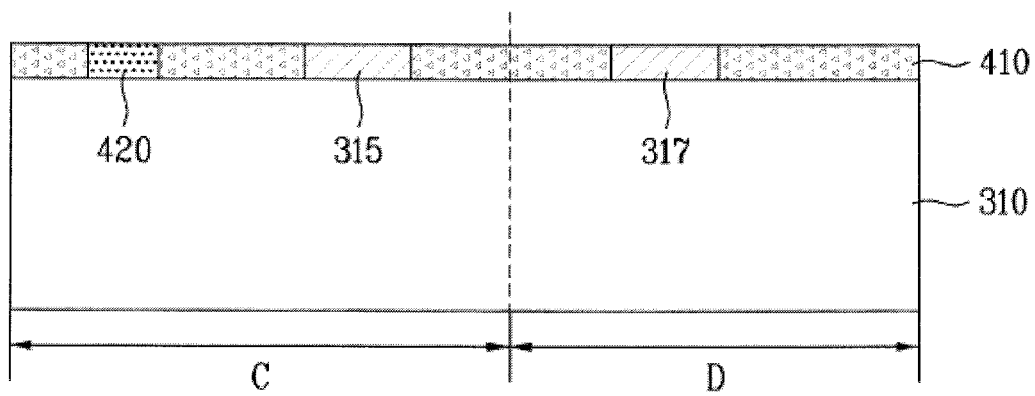

Referring to FIG. 3B, a contact hole 412 may expose a region of substrate 310. According to embodiments, contact hole 412 may be formed by selectively etching first dielectric film 410 formed on and/or over pixel region C. Referring to FIG. 3C, metal contact 420 may be formed, for example by filling contact hole 412 with a metal material. In embodiments, a metal material may include tungsten, copper and/or aluminum.

Figure 3D:
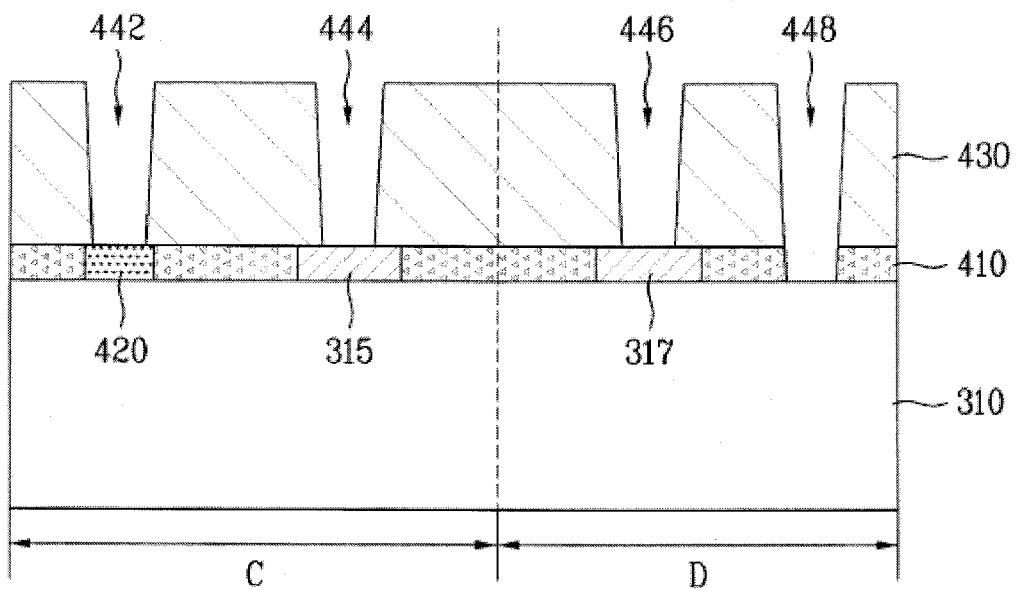

Referring to FIG. 3D, second dielectric film 430 may be formed on and/or over a surface, which may be an entire surface, of first dielectric film 410 provided with metal contact 420. According to embodiments, contact holes 442, 444, 446, and/or 448 may be formed and may expose contact 420 and a part of gate 315 on and/or over pixel region C, and/or a part of gate 317 and a region of substrate 310 on and/or over logic region D. In embodiments, contact holes may be simultaneously formed, for example by selectively etching second dielectric film 430.

According to embodiments, contact 420 formed on and/or over pixel region C may serve as a blocking barrier during an etching process to form contact holes on and/or over logic region D. In embodiments, damage to silicon, for example a photodiode region, of pixel region C may be minimized. In embodiments, first interlayer film 410 on and/or over logic region D may be continuously etched after the etching of second dielectric layer 430 has been completed, but first dielectric film 410 on and/or over pixel region C may be scarcely etched due to high etching selectivity of contact 410 and/or gate 315. In embodiments, although first dielectric layer 410 on and/or over logic region D may be sufficiently etched, damage to pixel region C due to etching may be minimized by a blocking effect of contact 410 and/or gate 315.

Figure 3E:
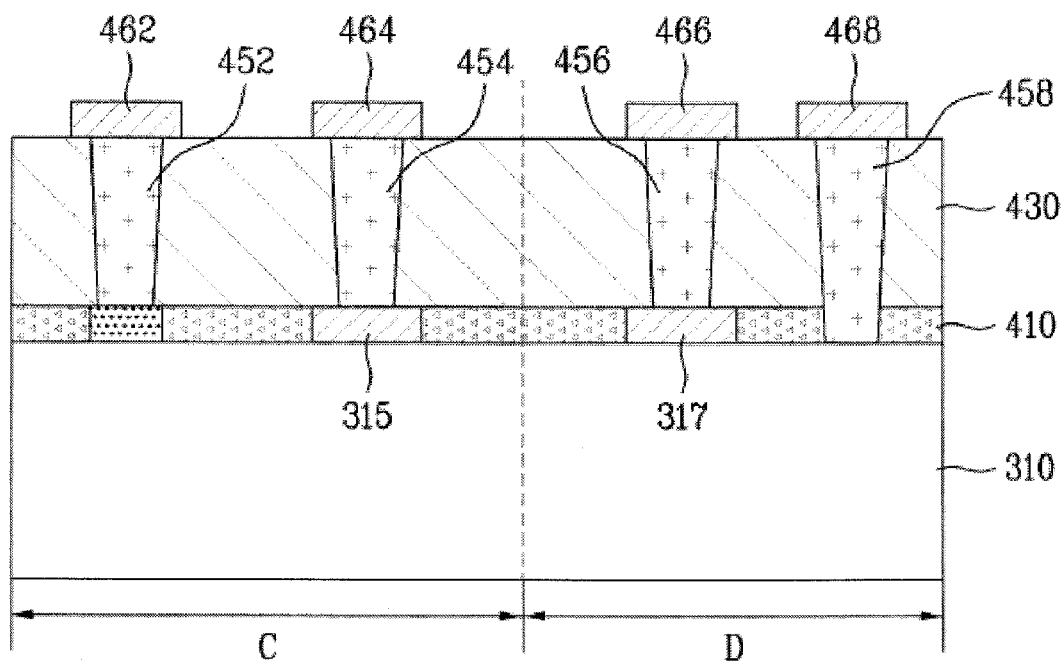

Referring to FIG. 3E, contacts 452, 454, 456, and/or 458 may be formed for example by filling contact holes 442, 444, 446, and/or 448 with a metal material. According to embodiments, metal lines 462, 464, 466, and/or 468 may be formed on and/or over second dielectric film 430 to be connected to respective contacts 452, 454, 456, and/or 458.

Embodiments relate to an image sensor. Referring to example FIG. 4, contacts of a unit pixel formed by a method in accordance with embodiments is illustrated. According to embodiments, contacts 510, 520, 530, 540, 550, and/or 560 on and/or over a pixel region may have a stack structure of contacts 342 and 362 and/or contacts 344 and 364, for example as illustrated in FIG. 2F. In embodiments, a stack structure may include that of contacts 420 and 452 and/or a structure of contact 454, as illustrated in FIG. 3E. However, embodiments are not limited thereto. In embodiments, at least one of contacts 510, 520, 530, 540, 550, and/or 560 on and/or over a pixel region may have substantially the same structure as contacts illustrated in FIG. 2F and/or 3E. In embodiments, drive transistor 130, for example of FIG. 4, may have a butting contact structure, in which a gate is connected directly to floating diffusion region 120.

According to embodiments, a method of fabricating an image sensor may include forming a contact hole on and/or over a pixel region and forming a contact hole on and/or over a logic region, which may be independently carried out. In embodiments, damage to a pixel region due to an etching process may be minimized. In embodiments, a dark current property may be maximized. In embodiments, a yield may be secured.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
preparing a substrate including a pixel region and a logic region each having at least one transistor and at least one gate;
forming a first interlayer dielectric film over the substrate to cover said at least one gate of said pixel region and said logic region;
forming first contact holes over said interlayer dielectric film to expose a region of the substrate corresponding to said pixel region and a part of said at least one gate of said pixel region;
forming first contacts by filling said first contact holes with a metal material;
forming a second interlayer dielectric film over a surface of said first interlayer dielectric film;
simultaneously forming second contact holes over said second interlayer dielectric film to expose said first contacts, and third contact holes over said second interlayer dielectric film and said first interlayer dielectric film to expose a region of the substrate corresponding to said logic region and a part of said at least one gate of said logic region; and
forming second contacts by filling said second contact holes and said third contact holes with a metal material.

2. The method of claim 1, wherein:
said first interlayer dielectric film is formed over an entire surface of the substrate; and
said first contact holes are formed by selectively etching said first interlayer dielectric film formed over said pixel region.

3. The method of claim 1, wherein the substrate comprises a silicon substrate.

4. The method of claim 1, wherein forming said first contact holes comprises:
forming a first photoresist pattern covering said first interlayer dielectric film formed over said logic region and exposing said first interlayer dielectric film corresponding to said region of the substrate corresponding to said pixel region and said part of the gate over said pixel region to be exposed, by carrying out a photolithography process over said first interlayer dielectric film;
forming said first contact holes by etching said first interlayer dielectric film using said first photoresist pattern as an etching mask; and
removing said first photoresist pattern.

5. The method of claim 1, wherein said first interlayer dielectric film comprises at least one of Boro-Phospho Silicate Glass and Tetra-Ethyl-Ortho-Silicate.

6. The method of claim 1, wherein said simultaneous formation of said second contact holes and said third contact holes comprises:
forming a second photoresist pattern exposing regions of said second interlayer dielectric film corresponding to said first contacts and regions of said second interlayer dielectric film corresponding to said region of the substrate corresponding to said logic region and said part of the gate of said logic region to be exposed;
simultaneously etching said second interlayer dielectric film and said first interlayer dielectric film over said pixel region and said logic region using said second photoresist pattern as an etching mask; and
removing the second photoresist pattern.

7. The method of claim 1, wherein said second interlayer dielectric comprises at least one of Boro-Phospho Silicate Glass and Tetra-Ethyl-Ortho-Silicate.

8. The method of claim 1, wherein said metal material comprises at least one of tungsten, copper and aluminum.

9. A method of comprising:
preparing a substrate including a pixel region and a logic region each having at least one transistor and at least one gate;
forming a first dielectric film to expose an upper surface of said at least one gate of said pixel region;
forming a first contact hole to expose a region of the substrate corresponding to said pixel region;
forming a first contact by filling said first contact hole with a metal material;
forming a second dielectric film over a surface of said first dielectric film;
simultaneously forming second contact holes to expose said first contact and a part of said at least one gate of said pixel region, and to expose a region of the substrate corresponding to said logic region and a part of said at least one gate of said logic region; and
forming second contacts by filling said second contact holes with a metal material.

10. The method of claim 9, wherein:
said interlayer dielectric film is formed over an entire surface of the substrate;
said first contact holes are formed by selectively etching said first dielectric film over said pixel region;
said second dielectric film is formed over an entire surface of said first dielectric film; and
said second contact holes are simultaneously formed by selectively etching said second dielectric film.

11. The method of claim 9, wherein forming said first dielectric film comprises:
depositing a dielectric material over an entire surface of said substrate corresponding to said pixel region and said logic region having said at least one gate; and
performing planarization of said dielectric material until said upper surface of said at least one gate of said pixel region is exposed.

12. The method of claim 9, wherein said first dielectric film comprises at least one of Boro-Phospho Silicate Glass and Tetra-Ethyl-Ortho-Silicate.

13. The method of claim 9, wherein said metal material comprises at least one of tungsten, copper and aluminum.

* * * * *